United States Patent
Hong

[19]

[11] Patent Number: 5,582,506
[45] Date of Patent: Dec. 10, 1996

[54] FAN ASSEMBLY FOR AN INTEGRATED CIRCUIT

[76] Inventor: Chen Fu-In Hong, No. 3, Lane 45, Yi-Yung Road, Kaohsiung, Taiwan

[21] Appl. No.: 604,487

[22] Filed: Feb. 21, 1996

Related U.S. Application Data

[63] Continuation-in-part of Ser. No. 399,041, Mar. 6, 1995, Pat. No. 5,522,700.

[51] Int. Cl.$^6$ ............................................ F04D 29/58
[52] U.S. Cl. ..................... 415/177; 165/80.3; 361/697
[58] Field of Search ................................. 415/177, 178, 415/211.1, 214.1; 165/80.3, 122, 125, 126; 361/695, 696, 697

[56] References Cited

U.S. PATENT DOCUMENTS

| | | | |
|---|---|---|---|
| 5,287,249 | 2/1994 | Chen | 165/80.3 |
| 5,299,632 | 4/1994 | Lee | 165/80.3 |
| 5,335,722 | 8/1994 | Wu | 165/122 |
| 5,377,745 | 1/1995 | Hsieh | 165/80.3 |
| 5,409,352 | 4/1995 | Lin | 415/177 |
| 5,421,402 | 6/1995 | Lin | 165/80.3 |

*Primary Examiner*—James Larson
*Attorney, Agent, or Firm*—Bacon & Thomas

[57] ABSTRACT

A fan device for an integrated circuit includes a finned plate, a fan having a rotor shaft, and a board member mounted to the finned plate. The finned plate includes a plurality of rows and columns of fins extending upwardly from an upper side thereof and a space defined in a center of the upper side, each two adjacent fins having a gap defined therebetween. The board member includes a hole defined in a mediate portion thereof, a support member provided in the hole, and a plurality of ribs extending downwardly from a periphery defining the hole to the support member, the support member including a stud formed on an upper side thereof and having a second hole defined therein for rotatably receiving the rotor shaft of the fan.

9 Claims, 6 Drawing Sheets

FAN ASSEMBLY FOR AN INTEGRATED CIRCUIT

CROSS-REFERENCES TO RELATED APPLICATIONS

This is a continuation-in-part application of U.S. patent application Ser. No. 08/399,041 filed on Mar. 6, 1995 U.S. Pat. No. 5,522,700.

BACKGROUND OF THE INVENTION

1. Field of the Invention

The present invention relates to a fan device for an integrated circuit and, more particularly, to an improved fan device which avoids accumulation of dust and the like.

2. Description of the Related Art

Heat transfer is an important factor to performance of integrated circuits. Although a wide variety of cooling devices have heretofore been provided, the results are not satisfactory in every respect. For example, U.S. Pat. No. 5,299,632 to Lee, issued on Apr. 5, 1994 and U.S. Pat. No. 5,309,983 to Bailey, issued on May 10, 1994 disclose heat dissipating devices comprising a motorized fan assembly which occupies a relatively large volume and thus may not be used in portable computers. U.S. Pat. No. 5,288,203 to Thomas, issued on Feb. 22, 1994, discloses a fan engaged in a fan frame member for reducing the volume of the fan, yet this adversely affects the heat transfer effect. Applicant's U.S. patent application Ser. No. 08/399,041 filed on Mar. 6, 1995 discloses a compact fan device to solve the problems in the prior art patents. Nevertheless, it is found that dust tends to accumulate in coils of the fan or other elements as an axle cap thereof which interconnects blades and which encloses a rotor shaft of the fan faces upwardly, resulting in malfunction of the fan and/or the integrated circuits as well as generation of noise during rotation of the fan. Furthermore, the amount of cool air induced by the fan is not maximized. The present invention is intended to provide an improved design to mitigate and/or obviate the above problems.

SUMMARY OF THE INVENTION

In accordance with the present invention, a fan device for an integrated circuit includes a finned plate, a fan having a rotor shaft, and a board member mounted to the finned plate. The finned plate includes a plurality of rows and columns of fins extending upwardly from an upper side thereof and a space defined in a center of the upper side, each two adjacent fins having a gap defined therebetween.

The board member includes a hole defined in a mediate portion thereof, a support member provided in the hole, and a plurality of ribs extending downwardly from a periphery defining the hole to the support member, the support member including a stud formed on an upper side thereof and having a second hole defined therein for rotatably receiving the rotor shaft of the fan.

In accordance with one aspect of the invention, the board member further includes a plurality of protrusions extending outwardly from at least one side thereof, each protrusion being fittingly received in an associated gap and thus being securely held between two associated adjacent fins.

In accordance with a further aspect of the invention, the board member further includes a plurality of resilient legs extending downwardly and outwardly from an underside thereof, each leg being fittingly received in an associated gap and thus being securely held between two associated adjacent fins.

In accordance with another aspect of the invention, the board member includes a plurality of third holes defined therein and is secured to the finned plate by fasteners, such as screws.

In accordance with still another aspect of the invention, one of the ribs has a groove defined therein through which electric wires of the fan extend as so to electrically connect a power source.

Other objects, advantages, and novel features of the invention will become more apparent from the following detailed description when taken in conjunction with the accompanying drawings.

DESCRIPTION OF THE PREFERRED EMBODIMENTS

Figure 1:
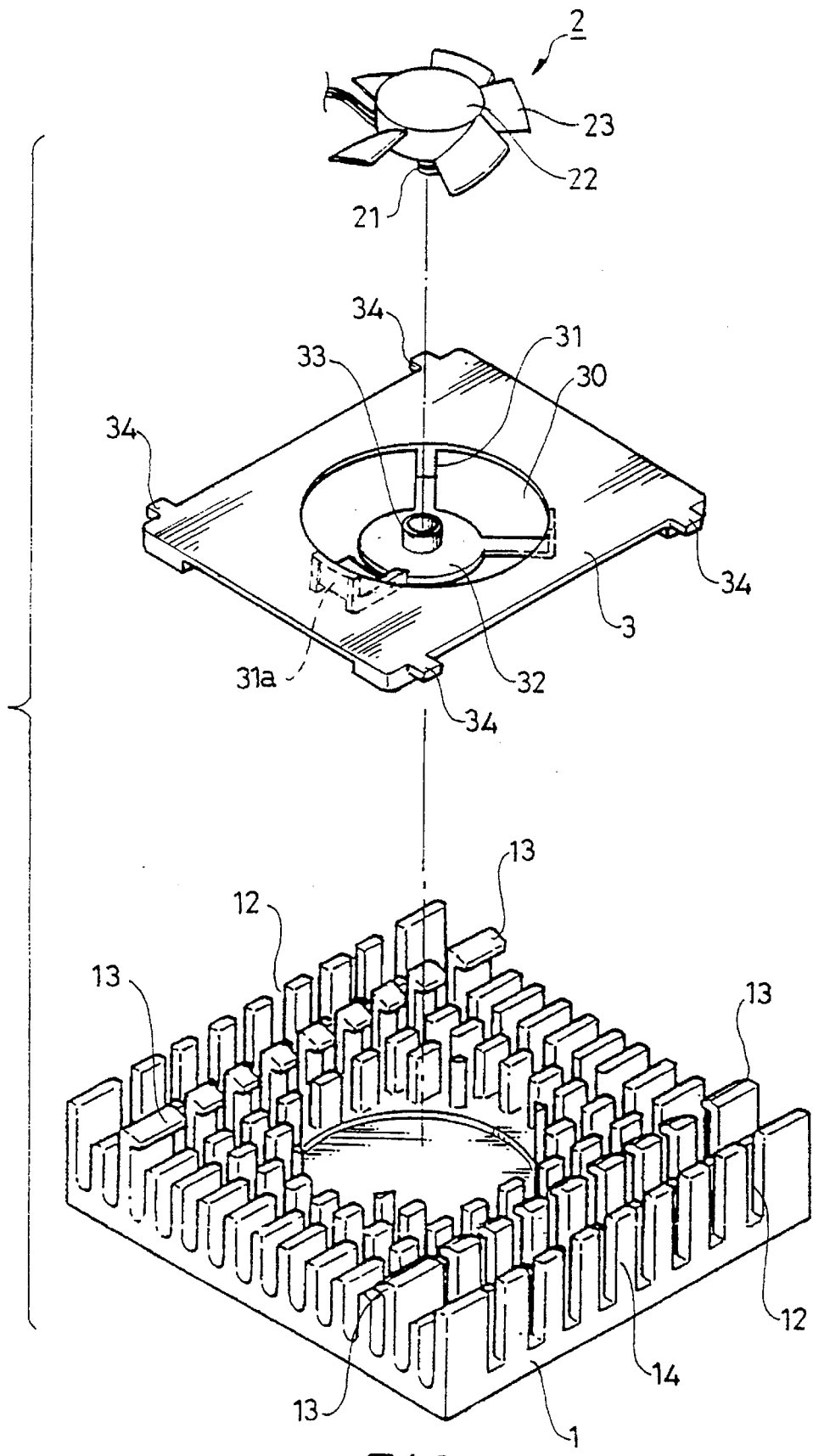
FIG. 1 is an exploded perspective view of a first embodiment of a fan device for an integrated circuit in accordance with the present invention.
Figure 2:
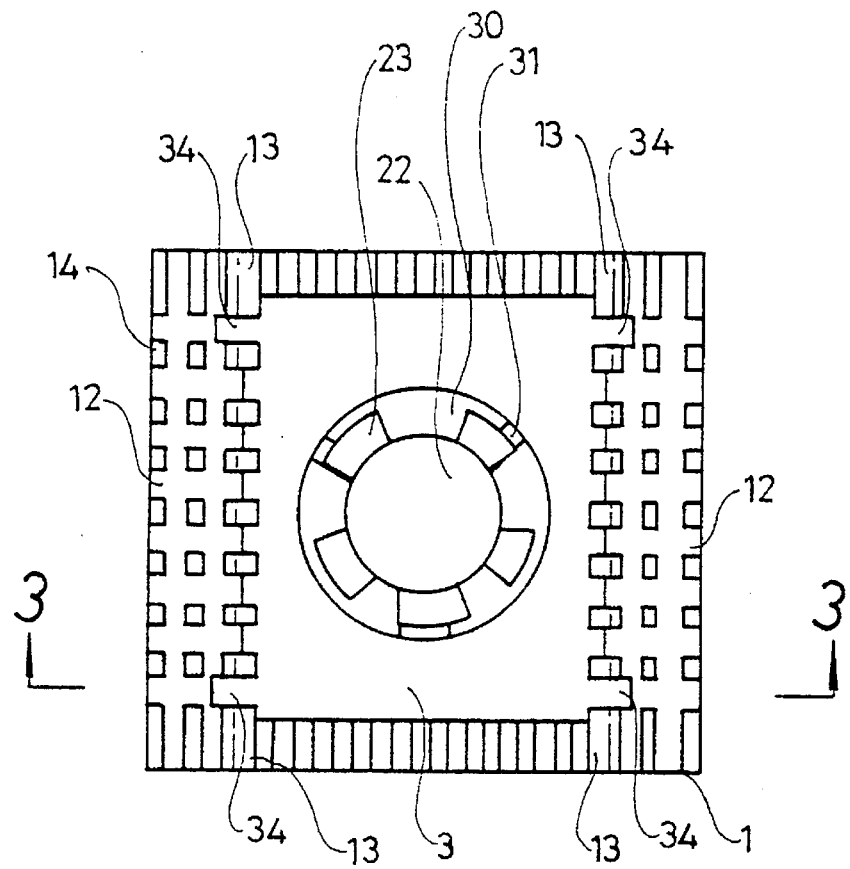
FIG. 2 is a top plan view of the assembled fan device in FIG. 1.
Figure 3:
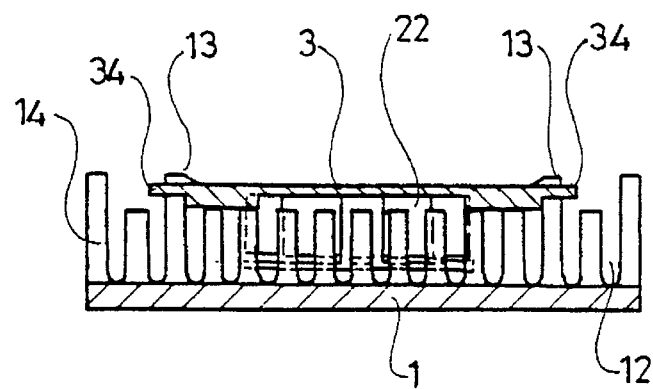
FIG. 3 is a cross-sectional view taken along line 3—3 in FIG. 2.

Referring to the drawings and initially to FIGS. 1 to 3, a fan device for an integrated circuit in accordance with the present invention generally includes a finned plate 1, a fan 2, and a board member 3. The finned plate 1 includes a plurality of rows and columns of fins 14 extending from an upper side thereof and a space 11 defined in a center of the upper side, each two fins 14 being separated by a gap 12 for air circulation purpose. The finned plate 1 is made of materials having excellent heat dissipation characteristics, such as aluminum. Preferably, the fins 14 are integral with the finned plate 1 and made of the same material. As shown in FIG. 1, each of two rows of fins 14 includes a snapping hooked end 13 in an upper end thereof for retaining the board member 3 in position.

The board member 3 includes a hole 30 defined in a mediate portion thereof and a support member 32 is provided in the hole 30 and connected to a periphery defining the hole 30 by a plurality of ribs 31. Each rib 31 extends downwardly from the periphery defining the hole 30 to the support member 32, and one of the ribs 31 has a groove 31a (see FIG. 1) through which electric wires (not labeled) of the fan 2 extend as so to electrically connect a power source (not shown). A stud 33 is formed on an upper side of the support member 32 and includes a hole (not labeled) defined therein for rotatably receiving a rotor shaft 21 of the fan 2. The board member 3 further includes a plurality of protrusions 34 extending outwardly from at least one side thereof, each protrusion 34 being fittingly received in an associated gap 12 and thus being securely held between two associated adjacent fins 14.

In assembly, as shown in FIGS. 2 and 3, the board member 3, after the fan 2 is mounted thereon, is snapped through the snapping hooked ends 13 of the fins 1 and is thus mounted to the finned plate 1 with the protrusions 34 received in associated gaps 12. The support member 32 and the fan 2 mounted thereon are received in the space 11 of the finned plate 1, while the snapping hooked ends 13 of the finned plate 1 assist in retaining the board member 3 in position. By such an arrangement, the coils of the fan 2 are shielded by an axle cap 22 interconnecting blades 23 of the fan 2 and enclosing the rotor shaft 21 of the fan 2 such that accumulation of dust does not easily occur, and rotation of the blades does not generate noise. In addition, a large amount of cool air can be induced to the finned plate 1 and passed through the gaps 12 between the rows and columns of the fins 14, thereby providing a better cooling effect.

Figure 4:
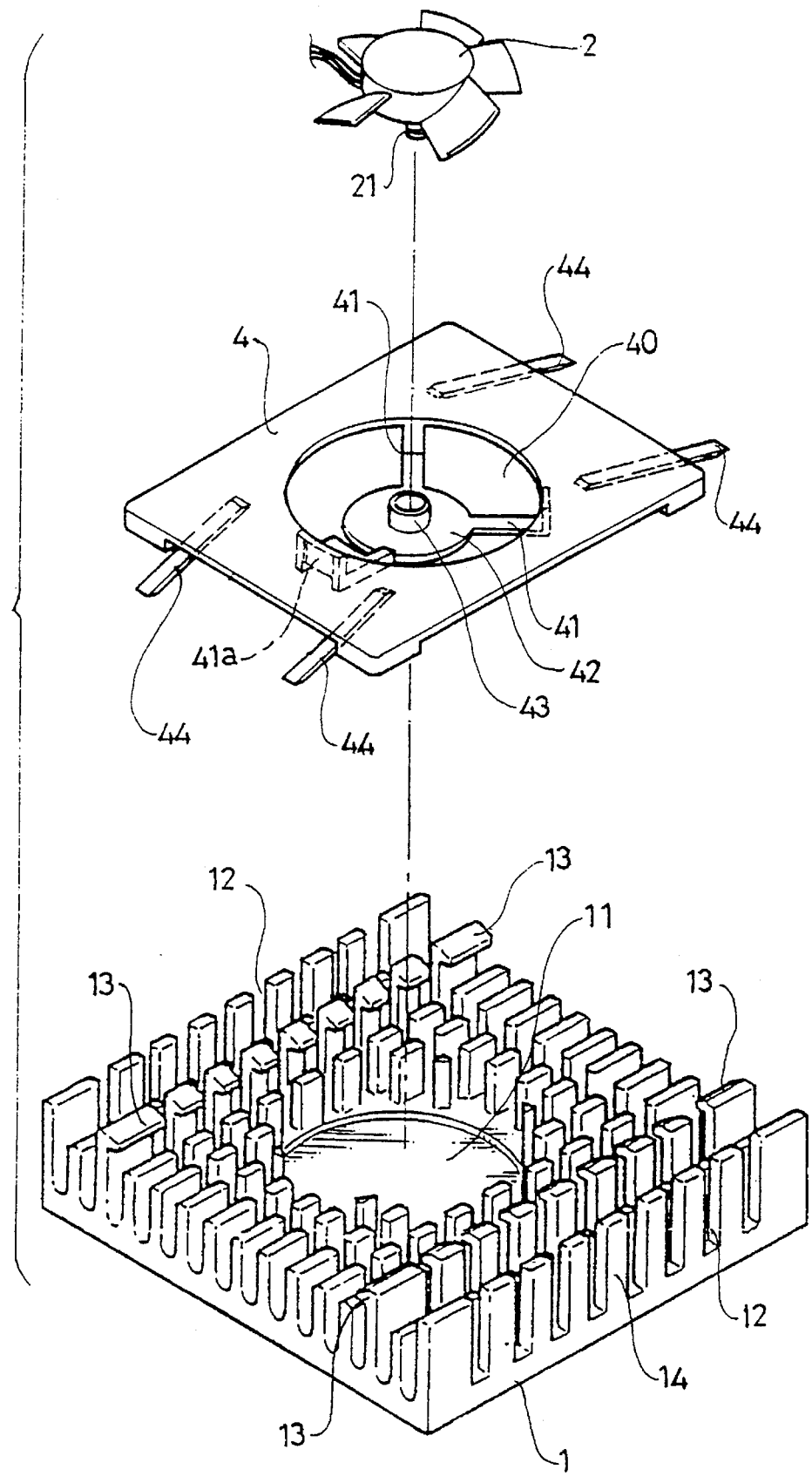
FIG. 4 is an exploded perspective view of a second embodiment of a fan device for an integrated circuit in accordance with the present invention.
Figure 5:
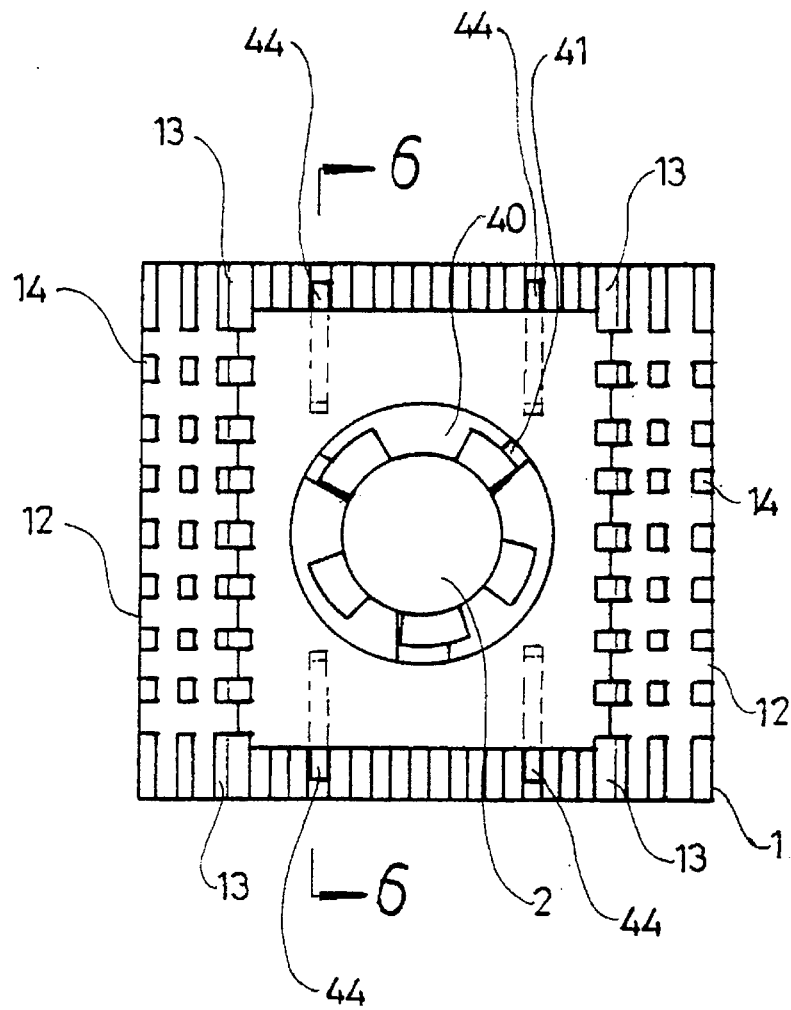
FIG. 5 is a top plan view of the assembled fan device in FIG. 4.
Figure 6:
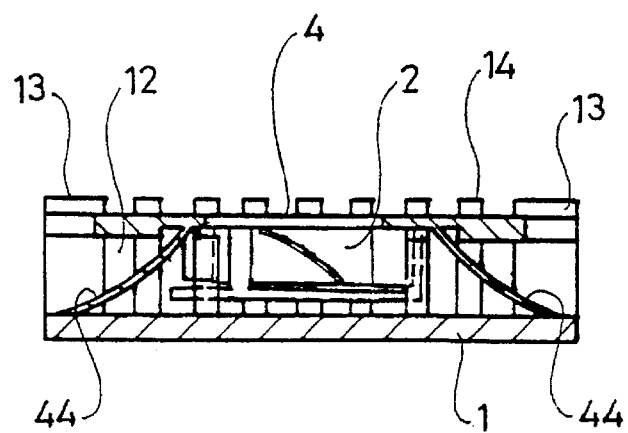
FIG. 6 is a cross-sectional view taken along line 6—6 in FIG. 5.

FIGS. 4 through 6 illustrate a second embodiment of a fan device in accordance with the present invention in which like elements are designated by like reference numerals. The fan device of the second embodiment includes a fan 2, a finned plate 1, and a board member 4, the fan 2 and the finned plate 1 being identical to those disclosed in the first embodiment and therefore not redundantly described. The board member 4 includes a hole 40 defined in a mediate portion thereof and a support member 42 is provided in the hole 40 and connected to a periphery defining the hole 40 by a plurality of ribs 41. Each rib 41 extends downwardly from the periphery defining the hole 40 to the support member 42, and one of the ribs 41 has a groove 41a (see FIG. 4) through which electric wires (not labeled) of the fan 2 extend as so to electrically connect a power source (not shown). A stud 43 is formed on an upper side of the support member 42 and includes a hole (not labeled) defined therein for rotatably receiving a rotor shaft 21 of the fan 2. The board member 4 further includes a plurality of legs 44 extending downwardly and outwardly from an underside thereof, each leg 44 being fittingly received in an associated gap 12 and thus being securely held between two associated adjacent fins 14 (see FIGS. 5 and 6). It is appreciated that the legs 44 are resilient and thus may absorb shocks and vibrations. It is further appreciated that the board member 4 may further include protrusions extending outwardly from at least one side thereof, similar to the protrusions 34 disclosed in the first embodiment, to provide a better positioning effect.

Figure 7:
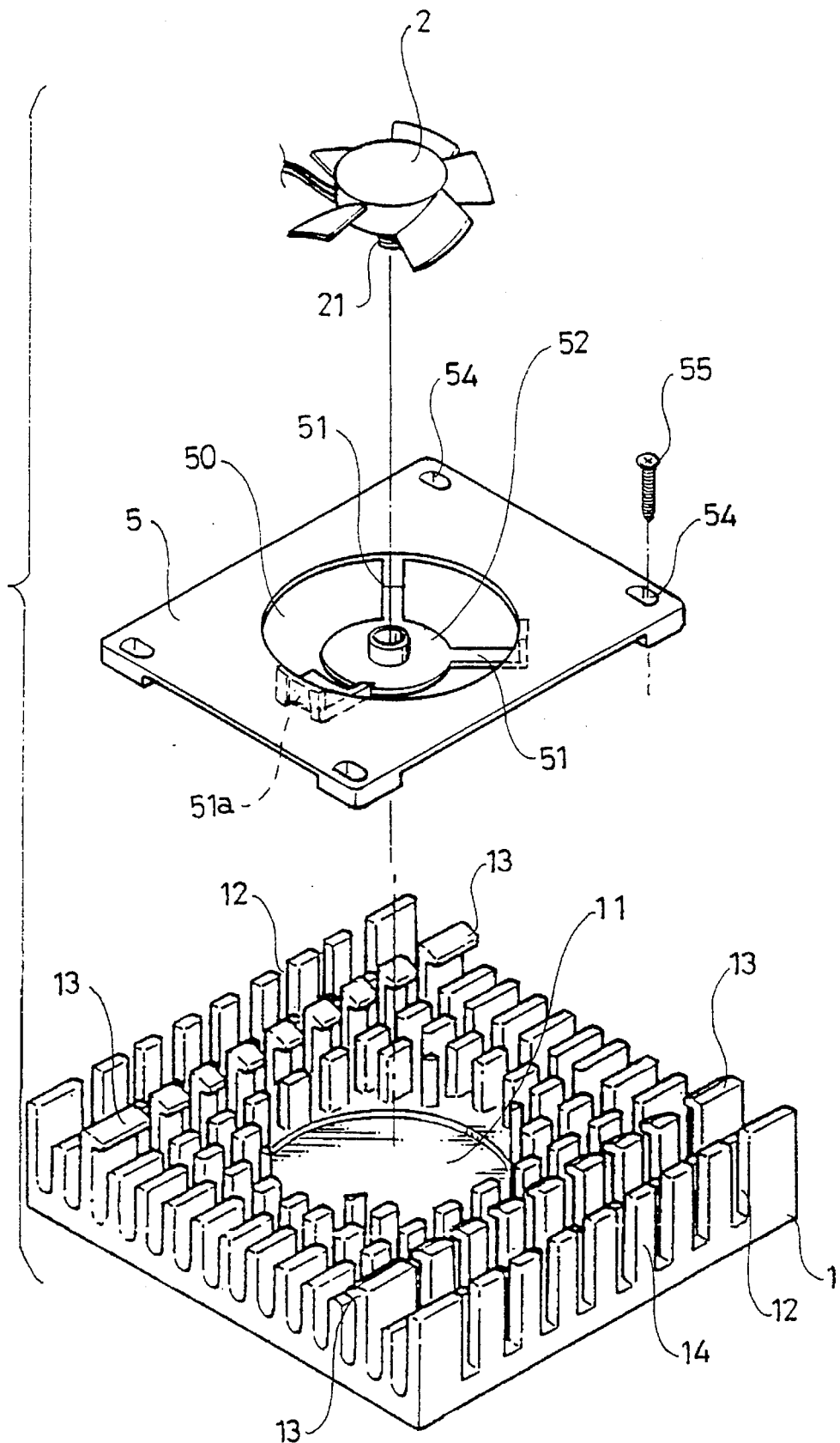
FIG. 7 is an exploded perspective view of a third embodiment of a fan device for an integrated circuit in accordance with the present invention.
Figure 8:
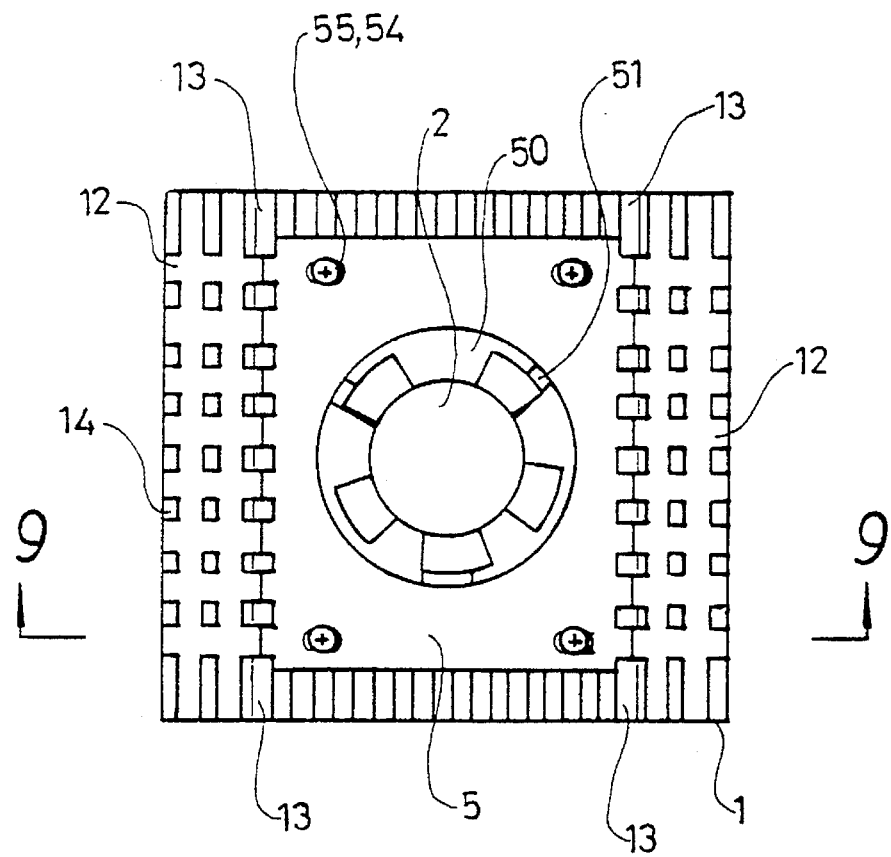
FIG. 8 is a top plan view of the assembled fan device in FIG. 7.
Figure 9:
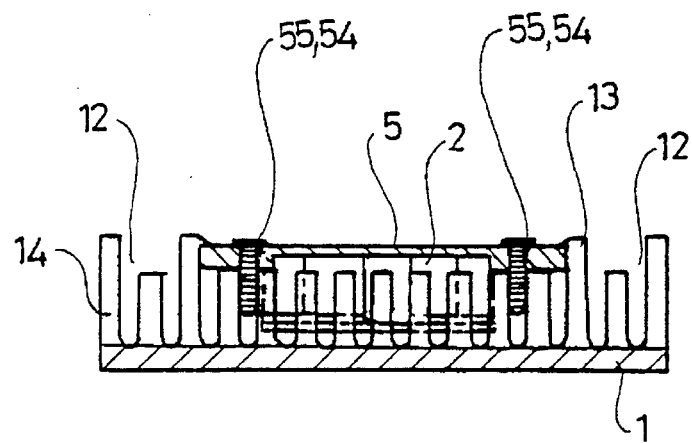
FIG. 9 is a cross-sectional view taken along line 9—9 in FIG. 8.

FIGS. 7 through 9 illustrate a third embodiment of a fan device in accordance with the present invention in which like elements are designated by like reference numerals. The fan device of the second embodiment includes a fan 2, a finned plate 1, and a board member 5, the fan 2 and the finned plate 1 being identical to those disclosed in the first and second embodiments and therefore not redundantly described. The board member 5 includes a hole 50 defined in a mediate portion thereof and a support member 52 is provided in the hole 50 and connected to a periphery defining the hole 50 by a plurality of ribs 51. Each rib 51 extends downwardly from the periphery defining the hole 50 to the support member 52, and one of the ribs 51 has a groove 51a (see FIG. 7) through which electric wires (not labeled) of the fan 2 extend as so to electrically connect a power source (not shown). A stud 53 is formed on an upper side of the support member 52 and includes a hole (not labeled) defined therein for rotatably receiving a rotor shaft 21 of the fan 2. Unlike the first and second embodiments, the board member 5 is fixedly mounted to the finned plate 1 by means of fasteners, such as screws 55 and associated screw holes 54.

According to the above description, it is appreciated that, as the axle cap 22 faces downwardly, the coils of the fan 2 are shielded by the axle cap 22 of the fan 2 such that accumulation of dust does not easily occur, and rotation of the blades does not generate noise. In addition, a maximum amount of cool air can be induced to the finned plate 1 and passed through the gaps 12 between the rows and columns of the fins 14, thereby providing a better cooling effect. Furthermore, the board member can be mounted to the finned plate 1 by screws, extending legs, or protrusions, or a combination thereof, thereby providing a reliable positioning effect.

Although the invention has been explained in relation to its preferred embodiment, it is to be understood that many other possible modifications and variations can be made without departing from the spirit and scope of the invention as hereinafter claimed.

What is claimed is:

1. A fan device for an integrated circuit comprising:
   a finned plate including a plurality of rows and columns of fins extending upwardly from an upper side thereof and a space defined in a center of the upper side, each two adjacent fins having a gap defined therebetween;
   a fan having a rotor shaft; and
   a board member securely mounted to the finned plate and including a hole defined in a mediate portion thereof, a support member provided in the hole, and a plurality of ribs extending downwardly from a periphery defining the hole to the support member, the support member including a stud formed on an upper side thereof and having a second hole defined therein for rotatably receiving the rotor shaft of the fan.

2. The fan device as claimed in claim 1, wherein the board member further includes a plurality of protrusions extending outwardly from at least one side thereof, each protrusion being fittingly received in an associated said gap and thus being securely held between two associated adjacent said fins.

3. The fan device as claimed in claim 1, wherein the board member further includes a plurality of resilient legs extending downwardly and outwardly from an underside thereof, each leg being fittingly received in an associated gap and thus being securely held between two associated adjacent said fins.

4. The fan device as claimed in claim 2, wherein the board member further includes a plurality of resilient legs extending downwardly and outwardly from an underside thereof, each leg being fittingly received in an associated gap and thus being securely held between two associated adjacent said fins.

5. The fan device as claimed in claim 1, wherein the board member includes a plurality of third holes defined therein and is secured to the finned plate by fasteners.

6. The fan device as claimed in claim 2, wherein the board member includes a plurality of third holes defined therein and is secured to the finned plate by fasteners.

7. The fan device as claimed in claim 3, wherein the board member includes a plurality of third holes defined therein and is secured to the finned plate by fasteners.

8. The fan device as claimed in claim 4, wherein the board member includes a plurality of third holes defined therein and is secured to the finned plate by fasteners.

9. The fan device as claimed in claim 1, in which one of the ribs has a groove defined therein through which electric wires of the fan extend as so to electrically connect a power source.

* * * * *